United States Patent
Wu et al.

(10) Patent No.: US 6,177,326 B1
(45) Date of Patent: Jan. 23, 2001

(54) METHOD TO FORM BOTTOM ELECTRODE OF CAPACITOR

(75) Inventors: Yi-Tyng Wu, Chiayi; Kuo-Chi Lin, Taipei Hsien, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/208,607

(22) Filed: Dec. 8, 1998

(51) Int. Cl.$^7$ ........................................ H01L 21/20
(52) U.S. Cl. .................. 438/396; 438/253; 438/255; 438/398; 438/578; 438/766
(58) Field of Search ............................ 438/253, 255, 438/396, 398, 514, 525, 578, 665, 666, 766, 978

(56) References Cited

U.S. PATENT DOCUMENTS

| | | | |
|---|---|---|---|
| 5,240,874 | * 8/1993 | Roberts | 438/298 |
| 5,773,342 | * 6/1998 | Fukase | 438/255 |
| 5,821,157 | * 10/1998 | Lee et al. | 438/514 |
| 5,831,282 | * 11/1998 | Nuttall | 257/64 |
| 6,013,549 | * 1/2000 | Han et al. | 438/253 |

* cited by examiner

Primary Examiner—Carl Whitehead, Jr.
Assistant Examiner—Jamie L. Davis
(74) Attorney, Agent, or Firm—Charles C. H. Wu; Charles C. H. Wu & Associates, APC

(57) ABSTRACT

A method for fabricating a bottom electrode is provided. In this method a dielectric layer is formed on a substrate having a source/drain region. A via hole is formed in the dielectric layer to expose the source/drain region. A patterned, doped polysilicon layer is formed on the dielectric layer and fills the via hole, wherein the cross-section of the patterned doped polysilicon layer is arced or polygonal. The surface of the patterned polysilicon layer is transformed into an amorphous silicon layer. A hemispherical-grain layer is formed on the amorphous silicon layer.

6 Claims, 2 Drawing Sheets

METHOD TO FORM BOTTOM ELECTRODE OF CAPACITOR

BACKGROUND OF THE INVENTION

1. Field of the Invention

The present invention relates to a method of fabricating semiconductor devices. More particularly the present invention relates to a method for fabricating a bottom electrode of a capacitor.

2. Description of the Related Art

As long as the trend for forming highly integrated circuits continues, methods capable of forming devices having smaller dimensions must be developed. Semiconductor devices having sub-micron line width are currently being manufactured. In the past, the means of increasing the packing density of integrated circuit devices has included the reduction of their structural dimensions. For a DRAM capacitor, that means a reduction of the surface area of its electrode. However, the amount of electric charge that can be stored in the capacitor is greatly reduced.

In general, the amount of stored charge within a DRAM capacitor must be above a certain threshold level so that the stored data can be retrieved correctly. When some of the dimensions of a DRAM capacitor are reduced, the maximum amount of charge the capacitor is capable of storing drops correspondingly. Furthermore, as the charge-storing capacity of the capacitor drops the frequency of refreshes necessary to compensate for the charges lost due to current leakage must be increased. Constant refreshes compromises the data processing speed of the DRAM. Hence, a method to reduce the area occupied by a capacitor on a semiconductor substrate without decreasing its storage capacity is a major issue for design engineers.

One solution to the charge storage problem of a DRAM capacitor is to grow hemispherical-grain silicon on the silicon surface of the bottom electrode. Given two capacitors formed using the same materials and having the same distance of separation between upper and bottom electrodes, the capacitor with hemispherical-grain silicon formed on its bottom electrode can have twice the capacitance of the one without hemispherical-grain silicon.

FIGS. 1A through 1C are schematic, cross-sectional diagrams used to depict steps in conventional method for fabricating a bottom electrode.

Referring to FIG. 1A, a substrate 100 having a MOS 102 is provided. A dielectric layer 104 is formed on the substrate 100. A via hole 106 is formed in the dielectric layer 104 to expose a source/drain region 103. A patterned, doped polysilicon layer 108 is formed on the dielectric layer 104 and fills the via hole 106, wherein the cross-section of the doped polysilicon layer 108 that lies on and above the top surface of the dielectric layer 104 is quadrangular. The source/drain region 103 is connected to the doped polysilicon layer 108. An ion implantation process 110 is performed.

Referring to FIG. 1B, a portion of the surface of the doped polysilicon layer 108 is transformed to an amorphous silicon layer 108a and the residue of the doped polysilicon layer 108 is remained as a doped polysilicon layer 108b.

Because the integration of semiconductors is increased, distance 111 between the doped polysilicon layer 108 becomes smaller. During the ion implantation process 110, the doped polysilicon layer 108 is shielded by other parts of the doped polysilicon layer 108 or other devices even though the angle of implantation is tilted. As the cross-section of the doped polysilicon layer 108 is quadrangular, the shielding effect is especially obvious. Thus, it is difficult to transform the entire surface of the doped polysilicon layer 108 into the amorphous silicon layer 108a. Referring to FIG. 1C, a hemispherical-grain layer 112 is formed on the amorphous silicon layer 108a. A bottom electrode is made of the doped polysilicon layer 108b, the amorphous silicon layer 108a and the hemispherical-grain layer 112.

Since not all the surface of the doped polysilicon layer 108 is transformed to the amorphous silicon layer 108a, just a portion of the surface of the bottom electrode is covered by the the hemispherical-grain layer 112, so that the surface area of the bottom electrode is not sufficiently increased.

SUMMARY OF THE INVENTION

Accordingly, the present invention is to provide a method for fabricating a bottom electrode whose cross-section is arced or polygonal to avoid the shielding effect that occurs during the implantation process.

To achieve these and other advantages and in accordance with the purpose of the invention, as embodied and broadly described herein, the invention provides a method for fabricating a bottom electrode. The method for fabricating this bottom electrode includes the following steps. A dielectric layer is formed on a substrate having a source/drain region. A via hole is formed in the dielectric layer to expose the source/drain region. A patterned, doped polysilicon layer is formed on the dielectric layer and fills the via hole, wherein the cross-section of the patterned, doped polysilicon layer is arced or polygonal. The surface of the patterned polysilicon layer is transformed to an amorphous silicon layer. A hemispherical-grain layer is formed on the amorphous silicon layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
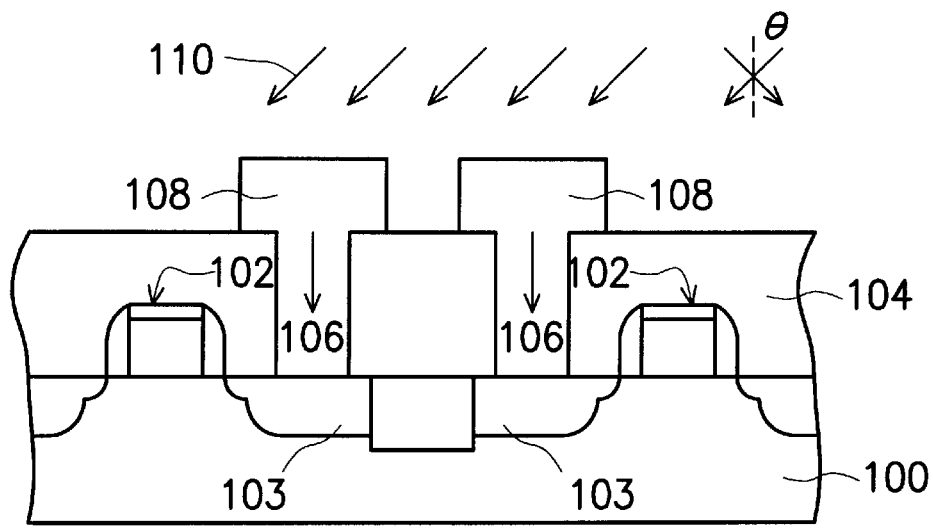
FIGS. 1A through 1C are schematic, cross-sectional diagrams used to depict steps in a conventional method for fabricating a bottom electrode.
Figure 1B:
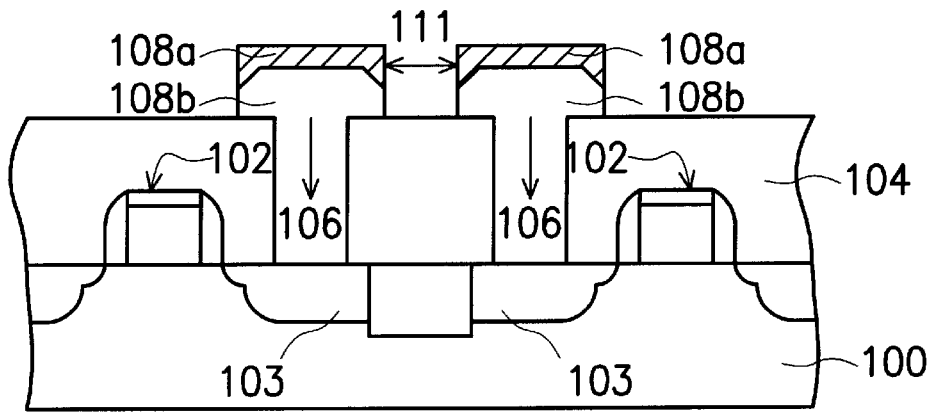
Figure 1C:
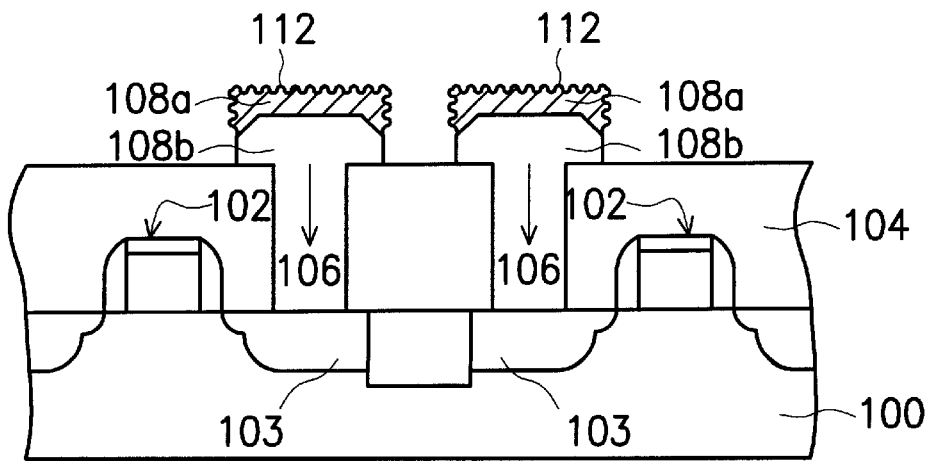

Reference will now be made in detail to the present preferred embodiments of the invention, examples of which are illustrated in the accompanying drawings. Wherever possible, the same reference numbers are used in the drawings and the description to refer to the same or like parts.

Figure 2A:
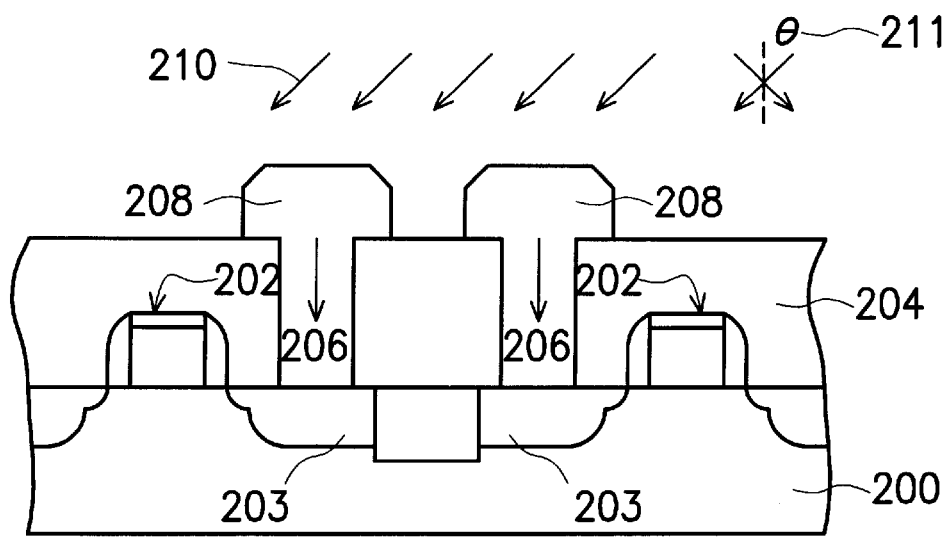
FIGS. 2A through 2C are schematic, cross-sectional diagrams used to depict steps in a method according to the invention for fabricating a bottom electrode.
Figure 2B:
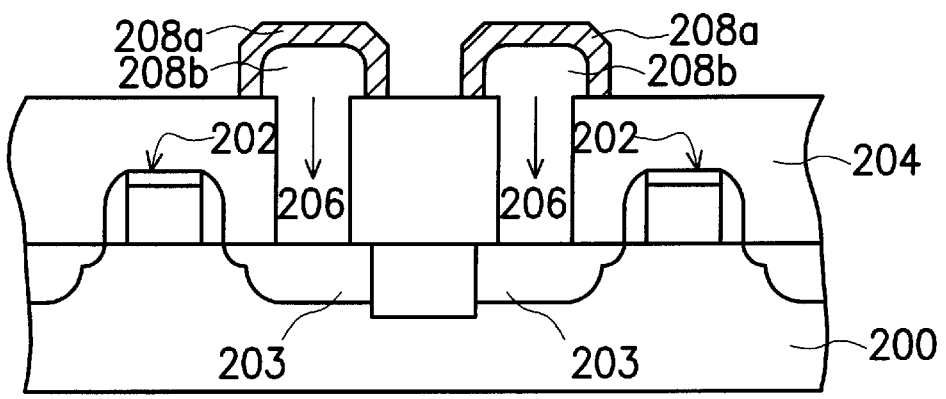
Figure 2C:
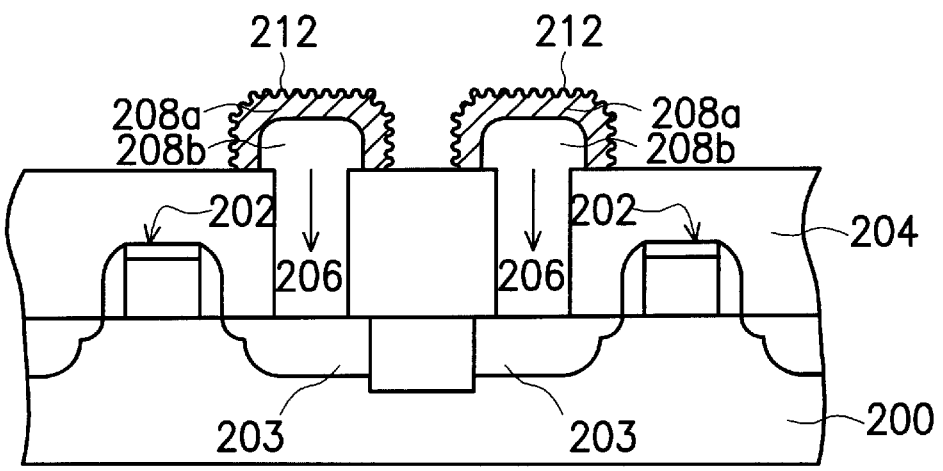

FIGS. 2A through 2C are schematic, cross-sectional diagrams used to depict steps in a method according to the invention for fabricating a bottom electrode.

Referring to FIG. 2A, a substrate 200 having a MOS 202 is provided. A dielectric layer 204 is formed on the substrate 200. A via hole 206 is formed in the dielectric layer 204 to expose a source/drain region 203. A patterned, doped polysilicon layer 208 is formed on the dielectric layer 204 and fills the via hole 206, wherein the cross-section of the doped polysilicon layer 208 that lies on and above the surface of the dielectric layer 204 is arced or polygonal. The source/drain region 203 is connected to the doped polysilicon layer 208.

The steps of forming the doped polysilicon layer 208 include the following steps. A doped polysilicon layer (not shown) is formed on the substrate 200 by, for example, chemical vapor deposition. A thin, patterned photoresist layer (not shown) is formed on the doped polysilicon layer. Then, the doped polysilicon layer exposed by the thin photoresist layer is removed by, for example, anisotropic etching. Because the edge of the photoresist layer is too thin a portion of the doped polysilicon layer covered by the edge of the photoresist layer is also etched. Thus, the doped polysilicon layer 208 is arced or polygonal in cross-section.

An ion implantation process 210 is performed. Preferably, angle of implantation 211 can be changed. The ions implanted are selected from a group consisting of phosphorus ions, arsenic ions, argon ions and nitrogen ions.

Referring to FIG. 2B, the entire surface of the doped polysilicon layer 208 is transformed into an amorphous silicon layer 208a.

The doped polysilicon layer 208 of this invention is arced or polygonal in cross-section, so that the shielding effect is avoided during the ion implantation process 210. All the surface region of the doped polysilicon layer 208 is able to transform into the amorphous silicon layer 208a.

Referring to FIG. 2C. a hemispherical-grain layer 212 is formed on the amorphous silicon layer 208a by. for example, chemical vapor deposition. A bottom electrode is made of the doped polysilicon layer 208b, the amorphous silicon layer 208a and the hemispherical-grain layer 212.

According to the foregoing, the shielding effect is avoided because the crosssection of the doped polysilicon layer 208 is arced or polygonal. All the surface of doped polysilicon layer 208 is transformed into the amorphous silicon layer 208a, so that all the surface of the bottom electrode can be covered by the hemispherical-grain layer 212. The surface area of the bottom electrode is increased and the capacitance is also increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a bottom electrode, comprising the steps of:

providing a substrate having a source/drain region;

forming a dielectric layer on the substrate;

forming via hole in the dielectric layer to expose the source/drain region;

forming a doped polysilicon layer on the dielectric layer to fill the via hole;

forming a patterned photoresist layer to covered a portion of the doped polysilicon layer;

removing the doped polysilicon layer using the patterned photoresist layer as a mask, wherein the patterned photoresist layer is so thin that an edge of the portion of the doped polysilicon layer covered by the patterned photoresist layer is removed to form an arced or polygonal shape of the polysilicon layer;

transforming a surface region of the remaining doped polysilicon layer into an amorphous silicon layer; and forming a hemispherical-grain silicon layer on the amorphous silicon layer.

2. The method of claim 1, wherein the step of removing the doped polysilicon layer using the patterned photoresist layer as a mask includes performing an anisotropic etching step.

3. The method of claim 1, wherein the step of transforming the surface region of the doped polysilicon layer into an amorphous silicon layer includes ion implantation.

4. The method of claim 3, wherein the ions implanted are selected from a group consisting of phosphorus ions, arsenic ions, argon ions and nitrogen ions.

5. The method of claim 1, wherein the step of forming the hemispherical-grain layer includes chemical vapor deposition.

6. A method for forming a bottom electrode, comprising the steps of:

providing a polysilicon layer;

forming a photoresist layer to cover a portion of the polysilicon layer;

patterning of the polysilicon layer using the photoresist layer as mask, wherein the photoresist layer is sufficiently thin to form the patterned polysilicon layer so shaped that all surface area of the patterned polysilicon layer is subject to a an ion implantation process; performing the ion implantation to transform the surface area of the patterned polysilicon layer into an amorphous silicon layer; and forming a hemispherical grain silicon layer on the amorphous silicon layer.

* * * * *